United States Patent [19]

DiVincenzo et al.

[11] Patent Number: 5,023,671
[45] Date of Patent: Jun. 11, 1991

[54] MICROSTRUCTURES WHICH PROVIDE SUPERLATTICE EFFECTS AND ONE-DIMENSIONAL CARRIER GAS CHANNELS

[75] Inventors: David P. DiVincenzo, Chappaqua; Kim Y. Lee, North Tarrytown; Theoren P. Smith, III, Yorktown Heights, all of N.Y.

[73] Assignee: International Business Machines Corporation, Armonk, N.Y.

[21] Appl. No.: 328,830

[22] Filed: Mar. 27, 1989

[51] Int. Cl.$^5$ ............................................. H01L 27/12
[52] U.S. Cl. ......................................... 357/4; 357/55; 357/63
[58] Field of Search ...................... 357/4, 22 A, 15, 32

[56] References Cited

U.S. PATENT DOCUMENTS 4,758,868  7/1988  Frijink ................................... 357/16

OTHER PUBLICATIONS

Yasuhiro Tokura; Conductivity Oscillation Due to Quantum Interference in a Proposed Washboard Transistor Appl. Phys. Lett. 51(22) Nov. 30, 1987, pp. 1807–1808.
"Quasi One Dimensional Channel GaAs/AlGaAs Modulation Doped FET Using a Corrugated Gate Structure", Jap. Journal of Appl. Phys., Dec. 1988, L2424, L2426; Okada et al.
"Heterostructure Traveling Wave Transistor", IBM Technical Disclosure Bulletin, vol. 31, No. 8, Jan. 1989, pp. 150–152, F. F. Fang et al.
"Negative Transconductance and Negative Differential Resistance in a Grid-Gate Modulation-Doped Field-Effect Transistor", appl. Phys. Lett. 54(5) Jan. 1989 by K. Ismail et al., pp. 460–462.
"Conductivity Oscillation Due to Quantum Interference in a Proposed Washboard Transistor", Appl. Phys. Lett. 51(22) Nov. 30, 1987, pp. 1807–1808, Y. Tokura et al.
"Fabrication of Quantum Wires in GaAs/AlGaAs Heterolayers", by S. Thomas et al., Journal of Vac. Soc. & Technology, B6(1), Jan./Feb. 1988, p. 127.
"Quantum Wire Superlattices and Coupled Quantum Box Arrays: A Novel Method to Suppress Optical Phonon Scattering in Semiconductors", by H. Sakaki, Japanese Journal of App. Phys., vol. 28, #2, Feb. 1989, pp. L314–L316.
"Quasi–one–dimensional Electron States in a Split–Gate GaAs/AlGaAs Heterostructure", by S. E. Laux et al., Surface Science 196 (1988) 101–106 Mar. 1988.
"Surface-Superlattice Effects in a Grating-Gate GaAs/GaAlAs Modulation Doped Field-Effect Transistor", by K. Ismail et al., Appl. Phys. Lett. 52(13) 3/28/88, p. 1071.

Primary Examiner—Jerome Jackson, Jr.
Assistant Examiner—R. Ratliff
Attorney, Agent, or Firm—Thomas J. Kilgannon, Jr.

[57] ABSTRACT

Quantum mechanical effect devices incorporate means for interrupting the two-dimensional carrier gas of a modulation doped structure to produce periodic potential variations which provide superlattice-like effects on current flowing nearby. The modulation doped structures incorporate specialized structures displaced from a current path which simultaneously confine the two-dimensional carrier gas into a quasi-one-dimensional carrier gas and subject the thus confined carrier gas and current flowing therein to superlattice-like effects by inducing periodic potential variations along the current path. The induced variations are produced by etching corrugations in the device edges or by forming them in biasing gates.

45 Claims, 4 Drawing Sheets

MICROSTRUCTURES WHICH PROVIDE SUPERLATTICE EFFECTS AND ONE-DIMENSIONAL CARRIER GAS CHANNELS

DESCRIPTION

Field of the Invention

This invention relates generally to superlattice structures and more specifically relates to modulation doped structures which can be substituted for known superlattice structures made from different materials. Still more specifically, it relates to modulation doped devices which incorporate specialized structures displaced from a current path which simultaneously confine a two-dimensional carrier gas into a quasi-one-dimensional carrier gas and subject the thus confined carrier gas to superlattice-like effects by inducing periodic potential variations along the current path. The induced variations are produced by etching corrugations in the device edges or by forming them in biasing gates. The fabrication of such structures basically invokes well-known lithographic and etching techniques eliminating the difficult but equally well-known deposition techniques used to fabricate superlattices.

BACKGROUND OF THE INVENTION

In the known prior art, modulation doped semiconductor structures show interdigitated comb gates or grids which modulate the carrier concentration of a two-dimensional electron gas which is closely coupled to a conducting layer. In an article entitled "Heterostructure Traveling Wave Transistor" by Fang et al, IBM Technical Disclosure Bulletin, Vol 31, No. 8, January 1989, pages 150–152, an interdigitated comb gate disposed on a modulation doped structure modulates the carrier concentration of a two-dimensional electron gas which is closely coupled to a conducting layer. The latter has a pair of spaced apart contacts to which an electric field is applied. When an AC signal is applied to the terminals of the gates, a periodic variation in the carrier density of the two-dimensional electron gas is obtained resulting in a longitudinally polarized standing wave. If the carrier relaxation time is long relative to the transit time between the fingers of the interdigitated gate electrode, the carriers will tend to bunch spatially with the same periodicity as that of the fingers. With a potential applied between the contacts to the closely coupled conducting layer, the carriers therein move and form a traveling space charge wave. When the velocity of the space charge wave is about equal to the wave velocity established by the AC signal applied to the gates and the drift velocity (ME) is larger than the wave velocity (fλ), there will be a strong coupling and energy transfer between the gate field and the electrons in the closely coupled layer resulting in signal amplification. In the arrangement of the reference, there is no superlattice effect involved because the elements involved are on too large a scale. Also, it should be noted that the interdigitated comb is not displaced from a current path so there is effectively no confinement of current which is quasi-one-dimensional in character. Also, in the present application, there is no need to apply AC potentials to the gate to obtain oscillatory behavior.

In another article entitled "Negative transconductance and negative differential resistance in a grid-gate modulation-doped field-effect transistor" by Ismail et al, Appl. Phys. Lett. 54 (5), 30 Jan. 1989, page 460, a grid-gate lateral-surface-superlattice (LSSL) field effect transistor in the modulation doped device environment is shown. The grid-gate provides a tunable, two-dimensional periodic potential modulation to electrons traveling from source to drain. This arrangement does not provide a preferential current path in that potential barriers in two-dimensions are interposed in the LSSL device directly in the current path. There is no lateral action at-a-distance which quantum mechanically affects carriers preferentially confined to a given current path so that the carriers act as if they have actually encountered superlattice structure but without the disadvantages of such heterojunction devices. In addition to providing a quasi-one-dimensional current path, the present approach also eliminates free electron behavior permitting the formation of true minigaps.

In an article entitled "Conductivity oscillation due to quantum interference in a proposed washboard transistor" by Tokura et al, Appl. Phys. Lett, 51 (22), 30 Nov. 1987, page 1807, a grating gate or washboard is shown disposed on the surface of a modulation doped device. The two-dimensional electron gas formed in the device is modulated by a weak periodic potential producing a conductivity oscillation due to the electron velocity modulation caused by a quantum interference effect. To the extent that the periodic potential applied to this structure extends from edge-to-edge of the structure, any current flow in a direction perpendicular to the elements of the washboard will be spread over the width of the device with no preferential current path. Thus, carriers will encounter induced potential barriers as they travel through the washboard device. Because there is no preferred current path inelastic scattering as well as loss of phase coherence can occur resulting in device characteristics degradation. The approach of the present application avoids such degradation by displacing the means which periodically interrupt the two-dimensional electron gas from a given current path so that current flow is provided with a preferential narrow current path. Displacing the interrupting means from the current path also quantum mechanically affects the carriers at-a-distance in such a way that the carriers act as if they had encountered a heterojunction type superlattice with all its associated advantages and none of its disadvantages.

An article entitled "Quasi-One-Dimensional Channel GaAs/AlGaAs Modulation Doped FET Using a Corrugated Gate Structure" by Okada et al, Jap. Journal of Appl. Phys. December 1988, 27 L2424-L2426, shows a modulation doped structure with a corrugated gate structure in which the electron gas confinement has been changed from two-dimensional to quasi-one-dimensional with a negatively biased gate voltage. Enhanced field-effect mobility and transconductance oscillations in a strictly confined one-dimensional channel regime were seen. In the article, a modulation doped structure is covered with a plurality of semiconductor stripes over which a gate electrode is conformally deposited forming a gate for two-source-drain pairs. A two-dimensional carrier gas (2DEG) is formed when the gate bias is zero. When negative bias is applied, the 2DEG becomes a plurality of quasi-one-dimensional gas regions, because the 2DEG is depleted in the regions without the stripes. With the change in bias, the transverse current disappears, but the longitudinal quasi-one-dimensional current remains. In the arrangement of the reference, the corrugations involved are placed directly in the current paths between the source/drain pairs and with zero bias. The 2DEG provides a current path between them.

With the application of bias, the 2DEG is partitioned into channels which extend between one source/drain pair. In this way, current flows between the one source/drain pair but not the other. There is therefore, no current flow in a direction perpendicular to the direction of the stripes in the presence of bias on the gate as there is in the embodiments of the present application where current flows in a quasi-one-dimensional channel when confined by a plurality of protuberances and indentations formed in gates or in the modulation doped structure itself. There doesn't appear to be any intention to fabricate a superlattice-like structure in which carriers encounter superlattice-like effects due to 2DEG interruption means disposed along and displaced from a current path.

U.S. Pat. No. 4,758,868, originally filed Jan. 3, 1983, shows in FIG. 1 an embodiment of a permeable base transistor which consists of an ohmic emitter contact on an n+ layer of gallium arsenide. A pair of insulating regions confine current flowing from the contact past a gate made of a plurality of fingers to a collector. In this arrangement, current flow is perpendicular to the plane of the finger rather than being in a plane parallel to the plane of the corrugations as in the device of the present application. In the present application, a quasi-one-dimensional gas is confined by the means for interrupting portions of the 2DEG such that deleterious behavior like scattering from heterojunctions is eliminated.

It is, therefore, an object of the present invention to provide a quantum mechanical effect device in which superlattice effects are experienced by carriers without the use of known superlattices with their alternating layers of different materials and associated interfaces.

Another object of this invention is to provide a quantum mechanical effect device in which heterojunction interfaces are eliminated while simultaneously providing superlattice-like effects on carriers.

Yet another object is to provide a quantum mechanical effect device wherein superlattice-like effects are produced in the modulation doped regime by periodically interrupting the two-dimensional carrier gas produced therein with means displaced from a current path which maintain or deplete portions of the carrier gas in a periodic fashion.

Still another object is to provide a quantum mechanical effect device in which inelastic scattering and loss of phase coherence due to the presence of discontinuities is substantially eliminated.

Another object is to provide a quantum mechanical effect device wherein available carriers are confined in a quasi-one-dimensional gas by the action of a plurality of protuberances and indentations strung along but displaced from the current path while being simultaneously subjected to superlattice-like effect.

These and other objects, features and advantages will become more apparent from the following more particular description of the preferred embodiments.

BRIEF SUMMARY OF THE INVENTION

The present invention relates to quantum mechanical effect devices wherein conventional modulation doped devices are adapted to exhibit superlattice-like phenomena. This is achieved by periodically interrupting the two-dimensional electron gas (2DEG) normally present in modulation doped devices, in one instance, with etched-out edge portions in the doped region of the wide band gap layer of such devices. The etched-out edge portions form a plurality of protuberances and indentations. A portion of the 2DEG is eliminated under each indentation providing a periodic potential variation which acts just as a superlattice would if it were comprised of alternating thin layers of semiconductor material. The protuberances and indentations may take the forms of rectilinear corrugations, sawteeth, scallops or sinusoidal variations which are periodic in character and where they are formed in a pair of opposite edges, the indentations are spaced apart by a narrow semiconductor region. The spacing is such that the potential variations induced cause the 2DEG to be confined into a quasi-one-dimensional gas forming a current path or channel along which carriers flow between device contacts.

In a similar way, a gate or gates disposed on the surface with protuberances and indentations shaped like those in the modulation doped device itself, under proper biasing conditions, will also exhibit superlattice behavior. Gate electrodes extending inwardly from the edges of the device have the protuberances and indentations formed in facing edges with a narrow spacer region spacing the gates apart. While superlattice-like effects may be exhibited by a plurality of protuberances and indentations strung along a single edge, the effects are much more pronounced when opposing device edges are similarly endowed. In addition to the more pronounced superlattice effects, when the protuberances and indentations are spaced apart by an extremely small distance in the nanometer range (10–250 nm), the region formed in between defines a current path which, in the underlying semiconductor materials, confines the 2DEG into a quasi-one-dimensional carrier gas capable of supporting current flow between electrodes connected to the ends of the current path. So, in addition to providing structures which may be substituted for known superlattice structures, the present invention also provides three and four terminal structures which are capable of high speed switching and of exhibiting oscillatory behavior. Apart from the novel structures shown herein, they can be fabricated using well-known lithographic and etching techniques eliminating the difficult and costly deposition techniques usually required by the prior art.

DESCRIPTION OF PREFERRED EMBODIMENTS

Figure 1:
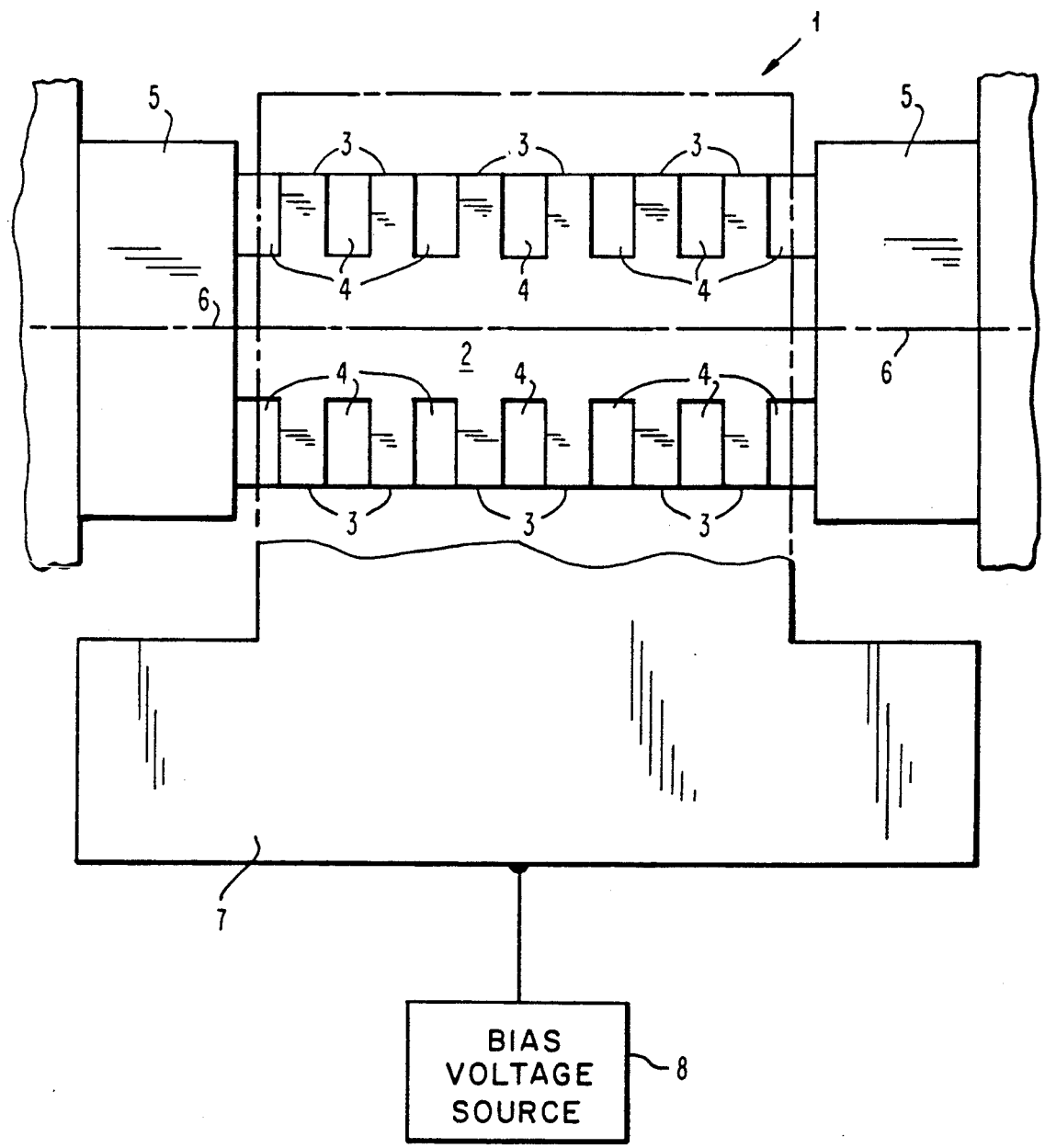
FIG. 1 shows a schematic top view of a quantum mechanical effect device in accordance with the teaching of the present application.

Referring now to FIG. 1, there is shown a schematic top view of a quantum mechanical effect device in accordance with the teaching of the present application. A quantum mechanical effect device 1 which exhibits superlattice-like behavior includes a modulation doped structure 2 having a plurality of protuberances 3 and a plurality of indentations 4 arrayed along the edges of structure 2. As will be seen in a more detailed discussion of modulation doped structure 2 in connection with FIG. 2 below, protuberances 3 and indentations 4 are formed in the doped upper portion of a relatively high band gap material like gallium aluminum arsenide by well-known lithographic and etching techniques. In FIG. 1, a pair of electrodes 5 contact the ends of structure 2 and when appropriate potentials are applied across electrodes 5, current flows between electrodes 5 along a given longitudinal axis. As will be seen hereinbelow in more detail, a two-dimensional carrier gas (2DEG) would exist as a sheet of carriers adjacent the heterojunction interface between a higher band gap material like gallium aluminum arsenide and a lower band gap material like gallium arsenide. However, in accordance with the teaching of the present invention, protuberances 3 and indentations 4 act as a means for periodically interrupting portions of the 2DEG in the edges of structure 2. Thus, where there are indentations 4 in the doped upper portion of the relatively high band gap material, there are no carriers present and regions in the lower band gap material registered beneath indentations 4 are devoid of carriers. Where there are protuberances 3, however, carriers are available and are supplied to regions in the lower band gap material registered beneath protuberances 3. In this manner, the 2DEG is periodically interrupted providing periodic potential variations in modulation doped structure 2. As a result, superlattice-like effects are produced which are the same as those provided by a plurality of thin alternating high and low band gap layers of semiconductor material found in the prior art provided device 1 has appropriate dimensions. In the arrangement of FIG. 1, current can flow in a channel provided by the 2DEG in a path parallel to given longitudinal axis 6. Because of the spacing between indentations 4, the 2DEG is confined such that a quasi-one-dimensional carrier gas is formed in which current can flow between electrodes 5 when the appropriate potentials are applied. In this regime, carriers flow relatively unimpeded between electrodes experiencing the periodic potential variations at-a-distance due to non-local effects. Indeed, where the dimensions of device 1 are less than the phase coherence length of electrons in such high-mobility heterostructures, i.e., less than 1–5μm, electrons can travel ballistically. This ballistic travel coupled with the periodic potential variations produced by the protuberances 3 and indentations 4 produces superlattice effects comparable to those obtained using deposition techniques without the attendant deposition difficulties and expense. Finally, in FIG. 1, a gate electrode 7 is shown disposed over structure 2. Gate electrode 7 is intended to provide a bias to control the flow of current between electrodes 5. Gate electrode 7 may be a metal which forms a Schottky barrier contact with the underlying semiconductor material. A bias voltage source 8 connected to gate 7 applies potentials which permit device 1 to act as an enhancement or depletion mode device. Operation of device 1 is normally carried out at liquid helium temperatures (4.2° K.) and below. Also depending on the type of dopant introduced into the upper surface of the doped aluminum gallium arsenide layer, the operative carriers may be either electron or holes. Depending on the conditions, device 1 can act as a high speed switch or as a source of high frequency oscillations.

While FIG. 1 shows a plurality of protuberances 3 and indentations 4 extending along both edges of structure 2, it should be appreciated that similar superlattice-like effects may be obtained by forming protuberances 3 and indentations 4 only along one edge of structure 2. To the extent that periodic potential variations are produced by forming periodic structures along both edges of structure 2, similar variations are obtained using such structures on only one edge resulting in similar albeit somewhat reduced superlattice-like effects. Under such circumstances, a straight edge (without protuberances and indentations) is used as a confining boundary with the indentations extending in from the facing edge being spaced from the straight edge by a distance sufficient to permit the formation of a quasi-one-dimensional gas in which carrier current flows.

Although structure 2 with its protuberances 3 and indentations 4 has been shown in FIG. 1 as a three-terminal device, it should be appreciated that structure 2 including protuberances 3 and indentations 4 may be used as a stand-alone superlattice structure and incorporated in any prior art device which requires a superlattice for its operation. The substitution of structure 2 with its means for periodically interrupting the 2DEG without the use of MBE deposition techniques, for example, represents a clear advance in both device structures and methodology.

Figure 2:
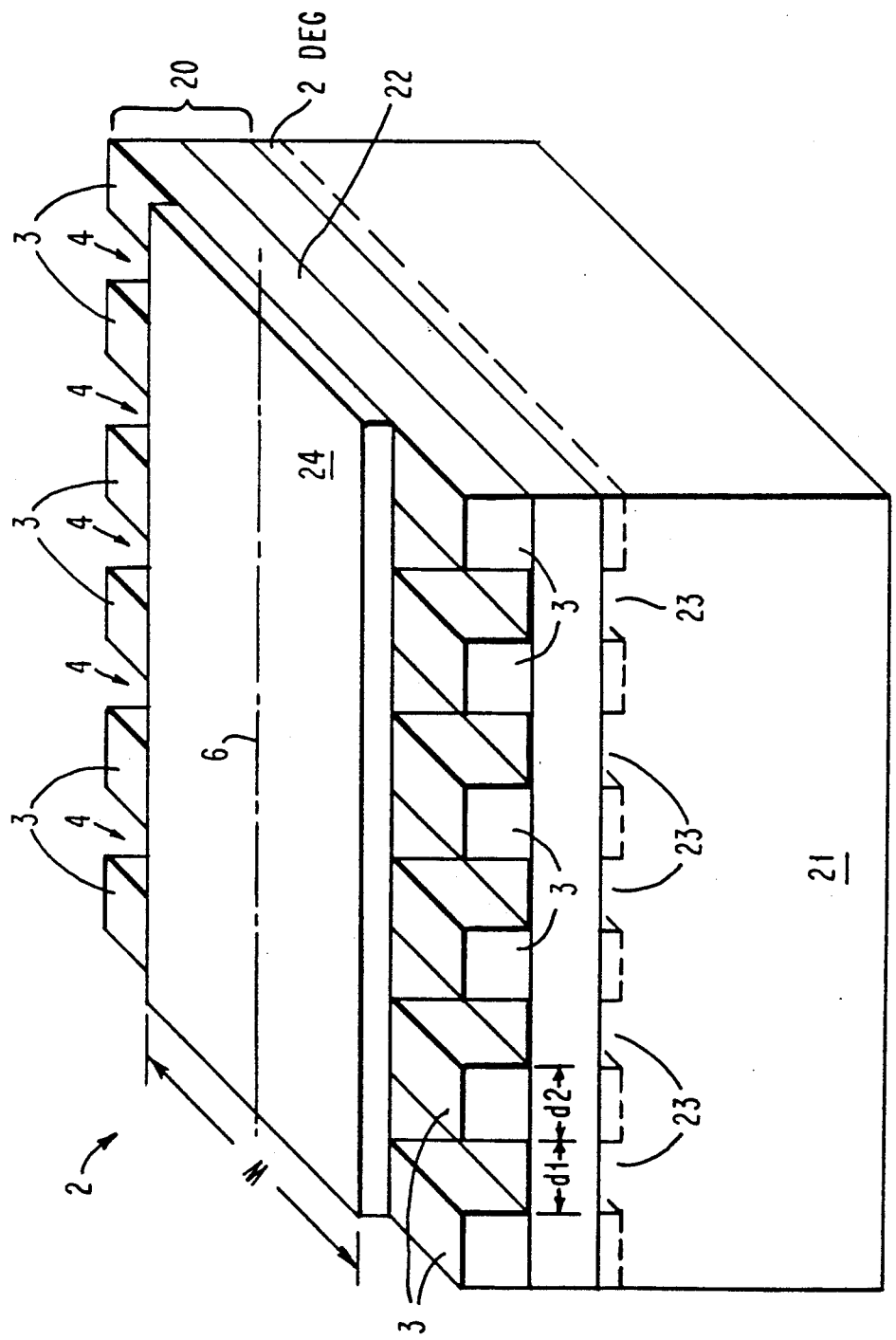
FIG. 2 is a perspective view of the modulation doped structure of FIG. 1 showing in detail and embodiment in accordance with the teaching of the present application which incorporates a means for maintaining portion of a 2DEG such that periodic potential variations are induced therein producing superlattice-like effects as well as quasi-one-dimensional confinement of the 2DEG.

FIG. 2 is a perspective view of the modulation doped structure 2 of FIG. 1 showing in detail an embodiment in accordance with the teaching of the present application. In FIG. 2, modulation doped structure 2 is fabricated in a well-known way by depositing a single crystal layer 20 of a III-V compound material such as gallium aluminum arsenide by molecular beam epitaxy (MBE) on the surface of a single crystal substrate 21 of a III-V compound such as gallium arsenide. The upper portion 22 of layer 20 is doped during MBE or by ion implantation with a dopant such as Si where the two-dimensional carrier gas formed adjacent the interface between layers 20, 21 is intended to be made up of electrons. The upper portion 22 of layer 20 is doped with a dopant such as Be where the two-dimensional carrier gas is intended to be made up of holes. Up to this point, the structure is a well-known modulation doped structure having a two-dimensional carrier gas disposed adjacent the interface between layers 20, 21. At this juncture, a plurality of protuberances 3 and indentations 4 are formed in doped upper portion 22 of layer 20 by well-known lithographic and etching techniques. More specifically, a layer of electron beam resist like polymethylmethacrylate (PMMA) is exposed to form exposed regions in the resist which when developed, have a desired shape. The underlying doped gallium aluminum arsenide exposed regions are reactively ion etched using a halogen containing plasmas like $CCl_2F_2$, Cl or Br or the appropriate wet chemistry as an etchant forming, as shown in FIG. 2, a plurality of rectilinear corrugations. Under the portions which have been removed or indentations 4, portions 23 of the 2DEG present at the interface between layers 20, 21 have also been removed since the supply of carriers which would have supplied the portions under indentations 4 have been effectively removed. To the extent it is desired to provide a means for biasing structure 2, a Schottky barrier metal like nickel-gold may be deposited atop layer 20 and then the above described masking and etching technique carried out. Alternatively, a metal stripe 24 may be deposited over the region between the inwardly extending indentations 4.

In FIG. 2, W is the distance between inwardly extending indentations 4 and is shown with a much greater spacing than if FIG. 2 were drawn to scale. Generally speaking, width W is sufficiently narrow to permit the formation of a quasi-one-dimensional gas or channel in semiconductor substrate 21 and is defined by the ends of indentations 4 extending inwardly from the edges of structure 2. A typical dimension for W is 50 nm and may have a range of 50-400 nm.

In FIG. 2, d1 and d2 are the dimensions of protuberances 2 and indentations 3, respectively, and, in the embodiment of FIG. 2, d1 and d2 are equal. Dimensions d1, d2 need not be equal. The only criterion that needs to be fulfilled is that the protuberances and indentations must be periodic. Typical dimensions for d1, d2 are in the nanometer range and, where d1, d2 are equal, they may be of the order of 10-200 nm and preferably 50 nm.

As indicated hereinabove, structure 2 of FIG. 2, with or without stripe 24 or other bias electrode, may be used wherever a layered superlattice was used in the prior art.

In a slight departure from the structure shown in FIG. 2, protuberances 3 and indentations 4 need only be formed in one edge of modulation doped structure 2 to achieve the same or similar superlattice effects as are obtained where both edges contain such protuberances 3 and indentations 4. Thus, one edge of the structure 2 would be straight while the other edge would contain protuberances 3 and indentations 4 similar to those shown in FIG. 2. In such an arrangement, the dimension, W, would extend from the end of inwardly extending indentations 4 to the straight edge of structure 2. Like the structure shown in FIG. 2, dimension W should be narrow enough to support a quasi-one-dimensional carrier gas adjacent the heterojunction between layer 20 and substrate 21. As in the device shown in FIG. 1, current would flow in a path formed by the quasi-one-dimensional carrier gas which is parallel to longitudinal axis 6 and extends between a pair of electrodes (not shown).

Figure 3:
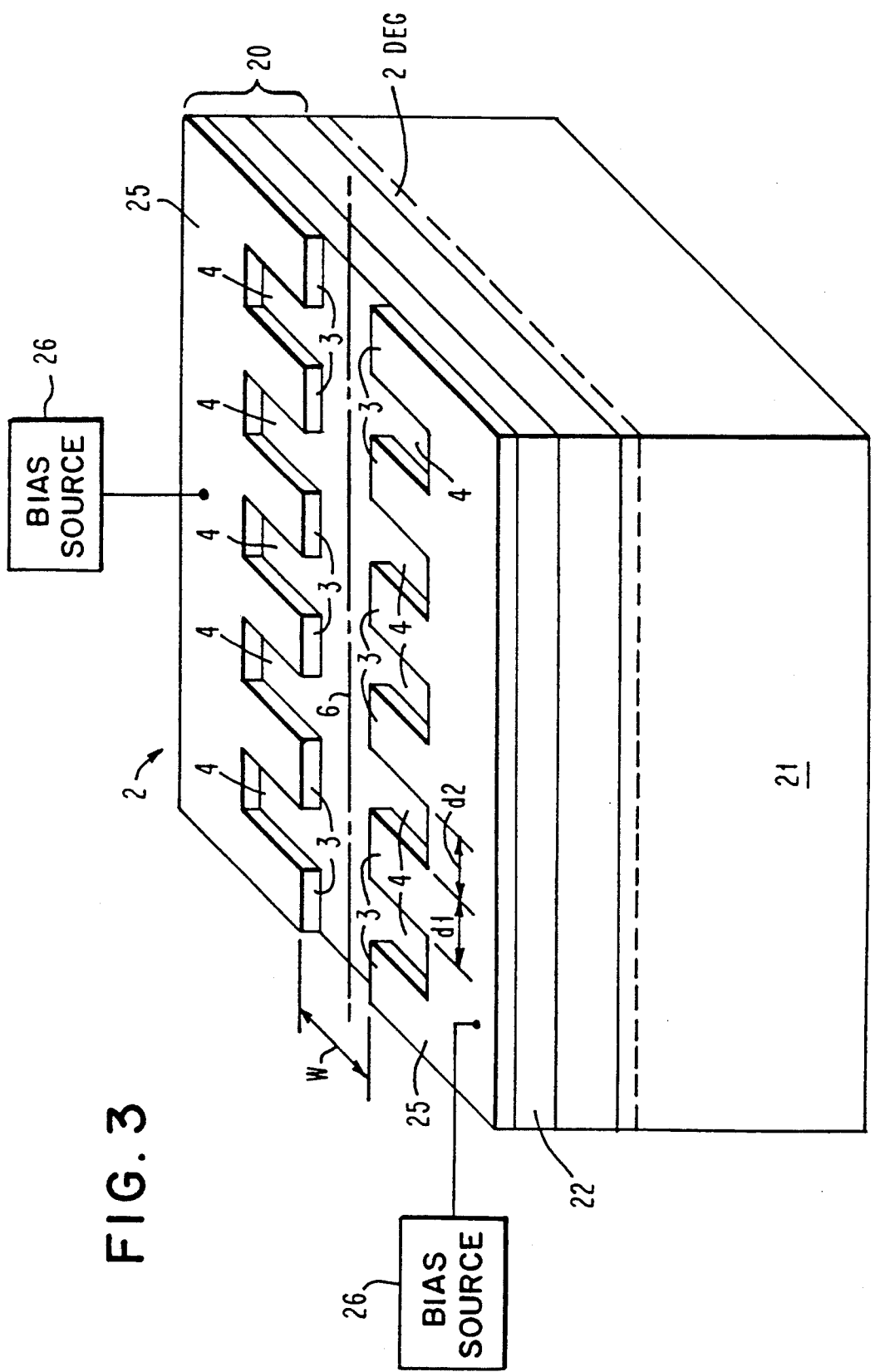
FIG. 3 shows a perspective view of a quantum mechanical effect device in accordance with the teaching of the present invention which incorporates a means for depleting portions of a 2DEG such that periodic potential variations are induced in a modulation doped structure producing superlattice-like effects in that structure.

FIG. 3 shows a perspective view of a quantum mechanical device in accordance with the teaching of the present invention which incorporates a means for depleting portions of a 2DEG such that periodic potential variations are induced in a modulation doped structure producing superlattice-like effects in that structure.

In considering FIG. 3, it should be appreciated that elements which are the same in FIGS. 2 and 3 have been given the same reference characters. Thus, structure 2 is comprised of a single crystal layer 20 deposited on a single crystal substrate 21. Layer 20 contains a doped upper portion 22 which provides carriers for forming a 2DEG adjacent the interface between layer 20 and substrate 21. At this point, the structure of FIG. 3 departs from the structure of FIG. 2 in that, instead of etching portions out of layer 20, a means for interrupting portions of the 2DEG is formed atop layer 20. The means includes a pair of metallic gates 25 which extend inwardly from the edges of structure 2, the facing edges of which contain protuberances 3 and indentations 4. In this arrangement, a plurality of rectilinear corrugations extend along longitudinal axis 6 and the protuberances 3 thereof are spaced apart from each other by a dimension, W. Like the corrugations shown in FIG. 2, dimensions d1, d2 may be equal but they can also be unequal provided they do not exceed the thickness dimension of prior art superlattice layers which permits them to exhibit superlattice effects. Also, distance, W, should be narrow enough to permit the existence of a quasi-one-dimensional gas which forms a channel along which current flows between a pair of electrodes (not shown) in a direction parallel to longitudinal axis 6. In the structure of FIG. 3, the 2DEG exists as a two-dimensional sheet of carriers adjacent the interface between layer 20 and substrate 21 in the absence of any bias. To achieve effects similar to that provided by structure 2 of FIG. 2, biases must be applied from variable bias sources 26 to metallic gates 25 which deplete the 2DEG of carriers under protuberances 3 inducing periodic potential variations in structure 2 which have superlattice-like effects on carriers traveling between a pair of electrodes (not shown) in the quasi-one-dimensional channel simultaneously created. Where the carriers are electrons, a negative bias is applied to gates 25 to deplete carriers from the underlying 2DEG. A positive bias to gate 25, of course, will deplete carriers from the 2DEG where the carriers are holes. Bias sources 26 are variable in character and when different biases are applied to metallic gates 25, the Fermi energy of structure is changed as well as the width of the quasi-one-dimensional gas or channel. Like the device of FIG. 2, the arrangement of FIG. 3 can be operated as a depletion or enhancement mode device and has applications as a high speed switch or oscillation source. Also, structure 2 of FIG. 3 may be substituted for prior art superlattices which incorporated alternating layers of different materials.

While the structure of FIG. 3 shows rectilinear corrugations extending inwardly from both edges of structure 2, it should be understood that the corrugations need only extend inwardly from one edge with the other metallic gate 25 presenting a straight edge to the facing corrugations of the other metallic gate 25. Such an arrangement still produces the desired periodic potential variations creating a somewhat reduced but still effective superlattice-like effect on carriers. The carriers are still confined into a quasi-one-dimensional gas between the straight edge of one metallic gate 25 and the ends of protuberances 3 of the other metallic gate 25. The dimensions W, d1, d2 in FIG. 3 are the same as the same dimensions mentioned in connection with the description of FIG. 2 hereinabove. Also, while rectilinear corrugations have been shown in FIG. 3, it should be appreciated that other corrugations having scalloped, sinusoidal or saw-tooth shapes may be substituted for the rectilinear corrugations. In fact, any shape corrugation may be used as long as they are periodic in character and can provide potential variations and confinement of a 2DEG into a quasi-one-dimensional gas.

The structure of FIG. 3 may be fabricated using well-known lithographic and lift-off techniques. After forming substrate 21 and layer 20 with its doped upper portion 22 in the same manner as described in connection with FIG. 2, a layer of electron beam resist is formed on the surface of layer 20. Using a mask and electron beam exposure, the resist is exposed everywhere except in the regions where indentations 4 will appear and in the spacer region between facing protuberances 3 and indentations 4. After developing and removal of the exposed portions of the resist, a layer of metal is conformally deposited on the uncovered portions of the surface of layer 20 and over the surface of the remaining resist. Then, using known lift-off techniques, the remaining resist with its covering of metal is removed leaving behind metallic gates 25 as shown in FIG. 3.

Figure 4:
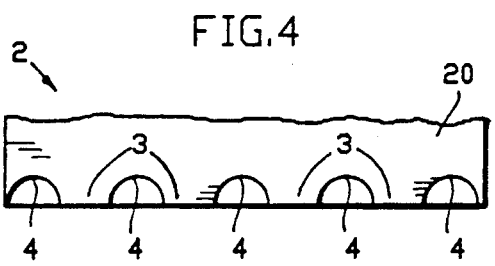
FIGS. 4, 5 and 6 are partially cut-away top views of a modulation doped structure showing examples of scalloped, sinusoidal and saw-tooth corrugations which may be etched in the edges of the modulation doped structure of FIG. 2.
Figure 5:
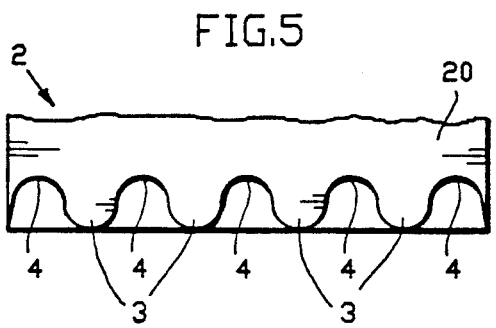
Figure 6:
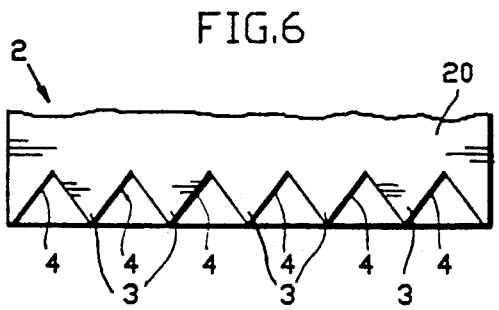

FIGS. 4, 5 and 6 are partially cut-away top views of a modulation doped structure showing examples of scalloped, sinusoidal and saw-tooth corrugations which may be etched in the edges of the structure of FIG. 2 instead of the rectilinear corrugations shown therein. These shapes will provide the desired periodic potential variations which will provide superlattice-like effects on carriers and simultaneously confine a 2DEG into a quasi-one-dimensional gas with a minimum of scattering.

Figure 7:
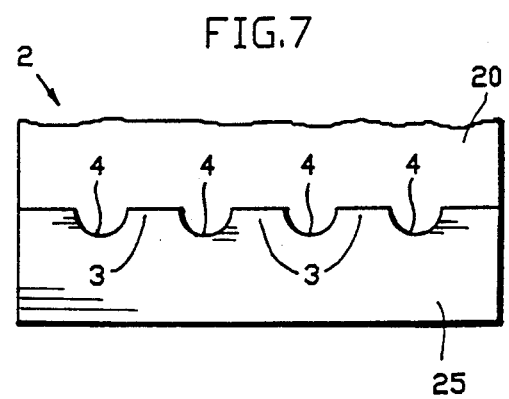
FIGS. 7, 8 and 9 are partially cut-away top views of a modulation doped structure showing examples of scalloped, sinusoidal and saw-tooth corrugations which may be formed in the gates of FIG. 3 instead of the rectilinear corrugations shown therein.
Figure 8:
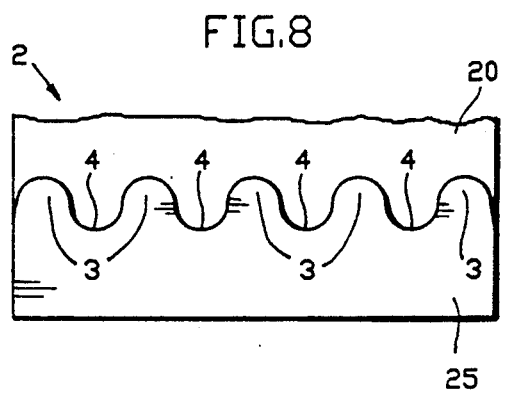
Figure 9:
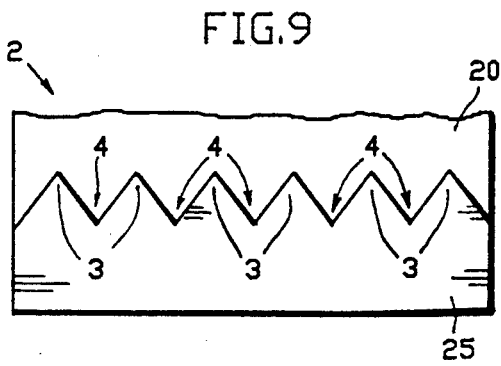

FIGS. 7, 8 and 9 are partially cut-away top views of a modulation doped structure showing examples of scalloped, sinusoidal and saw-tooth corrugations which may be formed in the gates of the structure of FIG. 3 instead of the rectilinear corrugations shown therein.

In connection with the devices described hereinabove, semiconductors like gallium arsenide and gallium aluminum arsenide have been mentioned as well as certain dopants and metals. It should be understood that the structures involved are not limited to the previously mentioned materials. Thus, other III-V compounds may be used as well as ternary and quaternary alloys and compounds of these materials. Examples of such materials are GaInAs, GaInAsP, GaAlSb and GaInSb. Dopants which make III-V compounds n-type include Si, Ge and Sn. Dopants which make III-V compounds p-type include Be, Cd and Zn. Metals which form Schottky barriers with III-V compound and can be used for both electrode 24 and metallic gates 25 include Al, Ni, W and Au.

The above described devices allow the exploitation of a variety of fundamental physical phenomena which are unique to electrons in periodic structures. Each corrugation on the quantum mechanical devices has an effect on an electron wave traveling down the channel in that it can cause disclosed partial reflection of the wave. It is well known that this reflection effect can be used to resonantly tune the conductance of such devices. However, with a long periodic array of such corrugations, much more can be done. The tuning effect (i.e., switch a channel from a conducting to a non-conducting state) can be tailored to be arbitrarily abrupt, and can be adjusted to any desired gate voltage by suitable shaping of the corrugations. This flexibility is unavailable in simple "resonant transmission" devices.

"Bloch oscillations" are another phenomenon which occur because of the superlattice structure which has no analog in simple, non periodic devices. This is a nonlinear effect which can be understood by considering an electron initially at rest inside the channel. A potential difference is applied which causes the electron to accelerate. As its velocity increases, the electron de Broglie wavelength decreases. When this wavelength is equal to the wavelength of the periodic corrugation, the "Bragg condition" is met and the corrugations, acting as a diffraction grating, reverse the direction of the electron. Now moving opposite to the electric field direction, the electron is decelerated, stopped and accelerated again in the forward direction and the whole process is repeated. This will occur as long as the electron is not scattered from impurities or imperfections in the device. Thus, applying a DC source-drain voltage results in an AC current response—the Bloch oscillations. This phenomenon is more likely to manifest itself in the devices of the present application than in prior art superlattice structures because the edge corrugation approach taught herein permits the electron to move through the device with less chance of scattering.

Several features of the Bloch oscillations can be predicted. The distance that the electrons oscillate back and forth in is roughly:

$$\text{distance} = \frac{h2}{am^*peE}$$

Here $h$ is Planck's constant, a is the interatomic spacing, $m^*$ is the effective mass, p is the distance between corrugations, e is the electron charge, and E is the electric field produced by the source-drain voltage. The frequency of the AC current oscillations will be:

$$\text{frequency} = \frac{eEp}{h}$$

This frequency needs to be greater than $1/\tau$, where $\tau$ is the impurity scattering time.

Having thus described our invention, what we claim as new, and desire to secure by Letters Patent is:

1. A quantum mechanical effect device comprising
   a layer of a wide band gap compound semiconductor material having a given longitudinal axis in the direction of current flow and edges parallel to said axis and a doped upper portion,
   a substrate of a narrower band gap compound semiconductor material forming an interface with said layer and a two-dimensional carrier gas adjacent said interface, and
   means laterally displaced from said given longitudinal axis disposed over said substrate for periodically interrupting said two-dimensional carrier gas to form a continuous, quasi-one-dimensional channel parallel to said given axis and for subjecting said channel to periodic potential variations along the length thereof.

2. A quantum mechanical effect device according to claim 1 wherein said means for interrupting and forming includes means for maintaining portions of said two-dimensional gas extending outwardly from the vicinity of said given longitudinal axis to at least one of said edges.

3. A quantum mechanical effect device according to claim 1 wherein said means for interrupting and forming includes means for depleting portions of said two-dimensional gas extending inwardly from at least one of said edges to the vicinity of said given longitudinal axis.

4. A quantum mechanical effect device according to claim 1 further including
   a pair of electrodes connected to the end portions of said device.

5. A quantum mechanical effect device according to claim 1 wherein said means for interrupting and forming includes a plurality of rectilinear corrugations disposed periodically in said doped upper portion.

6. A quantum mechanical effect device according to claim 1 wherein said means for interrupting and forming includes a plurality of scallops disposed periodically in said doped upper portion.

7. A quantum mechanical effect device according to claim 1, wherein said means for interrupting and forming includes a plurality of protuberances and indentations of sinusoidal shape disposed periodically in said doped upper portion.

8. A quantum mechanical effect device according to claim 1 wherein said means for interrupting and forming includes a plurality of protuberances and indentations of saw-tooth shape disposed periodically in said doped upper portion.

9. A quantum mechanical effect device according to claim 1 wherein said means for interrupting and forming includes a plurality of alternating protuberances and indentations disposed periodically in said doped upper portion.

10. A quantum mechanical effect device according to claim 1 wherein said means for interrupting and forming includes at least a gate electrode having a plurality of alternating protuberances and indentations disposed periodically therein.

11. A quantum mechanical effect device according to claim 1 wherein said means for interrupting and forming includes at least a gate electrode having a plurality of protuberances and indentations of saw-tooth shape disposed periodically therein.

12. A quantum mechanical effect device according to claim 1 wherein said means for interrupting and forming includes at least a gate electrode having a plurality of protuberances and indentations of sinusoidal shape disposed periodically therein.

13. A quantum mechanical effect device according to claim 1 wherein said means for interrupting and forming includes at least a gate electrode having a plurality of scallops disposed periodically therein.

14. A quantum mechanical effect device according to claim 1 wherein said means for interrupting and forming includes at least a gate electrode having a plurality of rectilinear corrugations disposed periodically therein.

15. A quantum mechanical effect device according to claim 1 further including biasing means disposed over said means for interrupting.

16. A quantum mechanical effect device according to claim 1 wherein said wide band gap and narrower band gap compound semiconductor materials are made from Groups III and V of the Periodic Table of Elements.

17. A quantum mechanical effect device according to claim 1 wherein said wide band gap compound semiconductor material is gallium aluminum arsenide and said narrower band gap compound semiconductor material is gallium arsenide.

18. A quantum mechanical effect device according to claim 2 wherein said means for maintaining includes a plurality of rectilinear corrugations disposed periodically in said doped upper portion.

19. A quantum mechanical effect device according to claim 2 wherein said means for maintaining includes a plurality of scallops disposed periodically in said doped upper portion.

20. A quantum mechanical effect device according to claim 2 wherein said means for maintaining includes a plurality of protuberances and indentations of sinusoidal shape disposed periodically in said doped upper portion.

21. A quantum mechanical effect device according to claim 2 wherein said means for maintaining includes a plurality of protuberances and indentations of saw-tooth shape disposed periodically in said doped upper portion.

22. A quantum mechanical effect device according to claim 2 wherein said means for maintaining includes a plurality of alternating protuberances and indentations of saw-tooth shape disposed periodically in said doped upper portion.

23. A quantum mechanical effect device according to claim 2 further including a pair of contacts connected to said device.

24. A quantum mechanical effect device according to claim 2 wherein said wide band gap and narrower band gap compound semiconductor materials are made from elements of Groups III and V of the Periodic Table of Elements.

25. A quantum mechanical effect device according to claim 2 wherein said wide band gap compound semiconductor material is gallium aluminum arsenide and said narrower band gap compound semiconductor material is gallium arsenide.

26. A quantum mechanical effect device according to claim 2 further including biasing means disposed over said means for maintaining.

27. A quantum mechanical effect device according to claim 3 wherein said means for depleting includes at least a gate electrode having a plurality of alternating protuberances and indentations disposed periodically therein.

28. A quantum mechanical effect device according to claim 3 wherein said means for depleting includes at least a gate electrode having a plurality of protuberances and indentations of saw-tooth shape disposed periodically therein.

29. A quantum mechanical effect device according to claim 3 wherein said means for depleting includes at least a gate electrode having a plurality of protuberances and indentations of sinusoidal shape disposed periodically therein.

30. A quantum mechanical effect device according to claim 3 wherein said means for depleting includes at least a gate electrode having a plurality of scallops disposed periodically therein.

31. A quantum mechanical effect device according to claim 3 wherein said means for depleting includes at least a gate electrode having a plurality of rectilinear corrugations disposed periodically therein.

32. A quantum mechanical effect device according to claim 3 further including biasing means connected to said means for depleting.

33. A quantum mechanical effect device according to claim 3 further including a pair of contacts connected to said device.

34. A quantum mechanical effect device according to claim 3 wherein said wide band gap and narrower band gap compound semiconductor materials are made from elements of Groups III and V of the Periodic Table of Elements.

35. A quantum mechanical effect device according to claim 3 wherein said wide band gap compound semiconductor material is gallium aluminum arsenide and said narrower band gap compound semiconductor material is gallium arsenide.

36. A quantum mechanical effect device according to claim 3 further including biasing means disposed over said means for depleting.

37. A quantum mechanical effect device according to claim 4 further including biasing means disposed over said means for interrupting and forming.

38. A quantum mechanical effect device according to claim 15 wherein said biasing means disposed over said means for interrupting and forming includes a Schottky barrier electrode.

39. A quantum mechanical effect device according to claim 23 further including biasing means disposed over said means for maintaining.

40. A quantum mechanical effect device according to claim 26 wherein said biasing means is a Schottky barrier electrode.

41. A quantum mechanical effect device according to claim 33 further including biasing means disposed over said means for depleting.

42. A quantum mechanical effect device according to claim 36 wherein said biasing means is a Schottky barrier electrode.

43. A quantum mechanical effect device according to claim 37 wherein said biasing means includes a Schottky barrier electrode.

44. A quantum mechanical effect device according to claim 39 wherein said biasing means is a Schottky barrier electrode.

45. A quantum mechanical effect device according to claim 41 wherein said biasing means is a Schottky barrier electrode.

* * * * *